United States Patent [19]
Ryum et al.

[11] Patent Number: 6,140,195
[45] Date of Patent: Oct. 31, 2000

[54] METHOD FOR FABRICATING A LATERAL COLLECTOR STRUCTURE ON A BURIED OXIDE LAYER

[75] Inventors: Byung-Ryul Ryum; Soo-Min Lee; Deok-Ho Cho; Tae-Hyeon Han, all of Daejeon, Rep. of Korea

[73] Assignee: Electronics and Telecommunications Research Institute, Daejeon, Rep. of Korea

[21] Appl. No.: 09/213,868

[22] Filed: Dec. 17, 1998

Related U.S. Application Data

[62] Division of application No. 08/891,014, Jul. 10, 1997, abandoned.

[30] Foreign Application Priority Data

Dec. 14, 1996 [KR] Rep. of Korea ............... 96-65727

[51] Int. Cl.[7] .................................................. H01L 21/331
[52] U.S. Cl. ........................... 438/311; 438/341; 438/481
[58] Field of Search .................................. 438/311, 309, 438/481, 341, 364; 257/565

[56] References Cited

U.S. PATENT DOCUMENTS

| 5,422,303 | 6/1995 | Klose et al. | 148/DIG. 11 |
| 5,484,738 | 1/1996 | Chu ent al. | 438/152 |
| 5,580,797 | 12/1996 | Miwa et al. | 438/311 |
| 5,614,425 | 3/1997 | Kimura et al. | 148/DIG. 163 |

*Primary Examiner*—Tuan H. Nguyen
*Attorney, Agent, or Firm*—Jacobson, Price, Holman & Stern, PLLC

[57] ABSTRACT

The present invention provides a collector device in a bipolar device, having a lateral collector structure on a buried oxide layer. This collector has a high breakdown voltage for high power and operating at a high speed, by isolating a horizontal collector from a substrate by a buried oxide film and horizontally connecting a buried collector to a collector. The buried collector film is formed on the buried insulating film, surrounding the collector film and being horizontally connected to the collector film.

4 Claims, 7 Drawing Sheets

IMPURITY IONs

METHOD FOR FABRICATING A LATERAL COLLECTOR STRUCTURE ON A BURIED OXIDE LAYER

This is a divisional application of application Ser. No. 08/891,014 filed Jul. 10, 1997, now abandoned.

BACKGROUND OF THE INVENTION

1. Field of the Invention

The present invention relates to a bipolar device having a lateral collector structure on a buried oxide layer and a method for fabricating the same, and more particularly to a bipolar device having a high breakdown voltage for high power and operating at a high speed, by isolating a horizontal collector from a substrate through a buried oxide film and horizontally connecting a buried collector to a collector.

2. Description of the Prior Art

In general, to obtain a high output characteristic in a bipolar device, the collector breakdown voltage must be increased, by increasing the thickness of the collector or decreasing the impurity concentration of the collector. However, in this case, because the resistance of the collector increases, it is natural that the operating speed should be low.

FIG. 1 is a cross-sectional view illustrating a collector in a bipolar device, which is formed by a nonselective ion-implanting process.

As shown in FIG. 1, after forming a buried collector 2 by implanting ions into a silicon substrate 1, a collector film 3 grows on the resulting structure. After forming a field oxide layer 4, a collector sinker 5 is formed so as to extend the region of the buried collector 2 up to the surface, by using the ion implantation process.

At this time, if the thickness of the collector film 3 increases by H1, the resistance of the collector film 3 itself may increase. Furthermore, when impurities are implanted into the collector film 3, in the case where the maximum projection depth of the implanted ions is shallower than the thickness of the collector film 3, the resistance of the collector film 3 may increase more and more.

FIG. 2 is a cross-sectional view illustrating a collector in a conventional bipolar device, which is formed by the selective epitaxial growth process.

As shown in FIG. 2, after forming a buried collector 12, an insulating film 13 is formed on the resulting structure. When the thickness of a collector film is thinner than the diffusion depth of ions for forming a collector sinker, the insulating film 13 is etched using a mask to define an active region and a collector sinker region, and then a collector film 14 and a collector sinker 15 selectively grow. To make the impurity concentration of the collector sinker 15 high, impurities are implanted into only the collector sinker region.

When the thickness of the collector film 14 is thicker than the diffusion depth of the impurity ions for forming the collector sinker 15, after the collector region is opened and the in-situ doped collector film 14 selectively grows and an upper portion thereof is oxidized, the collector sinker region is opened and the in-situ doped collector sinker 15 selectively grows.

Accordingly, in the case where the thickness of the collector film 14 is two thick, the selective growth process must be carried out two times. In addition, since the rate of the selective growth is slower than that of the nonselective growth, it will take a lot of time to grow the collector film 14 and the collector sinker 15 by H2. Furthermore, the resistance of the collector may increase due to the thickness of H2.

As stated above, in the case where the thickness of the collector becomes thick, the conventional technique as shown in FIG. 1 must be carried out in the in-situ doping method since it is not possible to implant dopants into not only the collector sinker but also the collector film. Accordingly, if the field oxide film is formed by applying the thermal oxidation process, such as the LOCOS (Local Oxidation of Silicon) method, to the collector film in such a manner that a part of the collector film remains unoxidized, the parasite capacitance introduced in between the metal wiring formed on the field oxide film and the unoxidized collector film may increase. Thereby, the speed of the integrated circuits may become slow and a delay of signal transmission and signal attenuation may appear in the device.

In the isolation process, the field oxidation with the field stop ion implantation or the trench can be carried out. However, the thicker the thin collector film is, the deeper the trench is. Accordingly, since the width of the trench must be wide, it is difficult to decrease the area of the device. Also, the parasite capacitance between the buried collector film and the substrate further reduces the speed of the device.

SUMMARY OF THE INVENTION

It, therefore, is an object of the invention to provide a bipolar device having a high breakdown voltage for high power and operating at a high speed, by isolating a horizontal collector from a substrate by a buried oxide film and horizontally connecting a buried collector film to a collector.

In accordance with an aspect of the present invention, there is provided a collector device in a bipolar device, the collector comprising: an SOI substrate including a silicon substrate, a buried insulating film formed on the silicon substrate, and a first collector film formed on the buried insulating film; a buried collector formed on the buried insulating film, surrounding the first collector film and being horizontally connected to the first collector film; and a second collector film formed on an active region of the first collector film.

In accordance with another aspect of the present invention, there is provided a collector device in a bipolar device, the collector comprising: an SOI substrate including a silicon substrate, a buried insulating film formed on the silicon substrate, and a first collector film formed on the buried insulating film; a buried collector formed on the buried insulating film, surrounding the first collector film and being horizontally connected to the first collector film; a second collector film formed on an active region of the first collector film; and a collector sinker film formed on a portion of the buried collector film.

In accordance with a further aspect of the present invention, there is provided a collector device in a bipolar device, the collector comprising: a silicon substrate; an insulating film formed on the silicon substrate; a field insulating film formed on the silicon substrate, being separated from the insulating film; a semiconductor layer formed on the silicon substrate and between the insulating film and the field insulating film; a first collector film formed on the insulating film; a buried collector formed on the semiconductor layer, surrounding the first collector film and being horizontally connected to the first collector film, wherein the buried collector is formed between the field insulating film and the first collector film; and a second collector film formed on an active region of the first collector film.

In accordance with a still further aspect of the present invention, there is provided a collector device in a bipolar device, the collector comprising: a silicon substrate; an insulating film formed on the silicon substrate; a field insulating film with a thickness equal to the sum of the insulating film and following first collector film, formed on the silicon substrate, being separated from the insulating film; a semiconductor layer formed on the silicon substrate and between the insulating film and the field insulating film; a first collector film formed on the insulating film; a buried collector formed on the semiconductor layer, surrounding the first collector film and being horizontally connected to the first collector film, wherein the buried collector is formed between the field insulating film and the first collector film; a second collector film formed on an active region of the first collector film; and a collector sinker film formed on a portion of the buried collector.

In accordance with an aspect of the present invention, there is provided a method for forming collector device in a bipolar device, the method comprising the steps of: preparing an SOI substrate providing a silicon substrate, a buried insulating film and a first collector film; forming a field oxide film, by oxidizing the first collector film in an outside of an active region; forming an ion-implantation mask on the first collector film, exposing both sides of the first collector film; forming a buried collector, by applying an ion implantation process to the exposed portion of the first collector film; removing the ion-implantation mask; and forming a second collector film on the active region of the first collector film.

In accordance with another aspect of the present invention, there is provided a method for forming collector device in a bipolar device, the method comprising the steps of: preparing an SOI substrate providing a silicon substrate, a buried insulating film and a first collector film; forming a field oxide film, by oxidizing the first collector film in an outside of an active region; forming a first ion-implantation mask on the first collector film, exposing both sides of the first collector film; forming a buried collector, by applying an ion implantation process to the exposed portion of the first collector film; removing the first ion-implantation mask; forming an insulating film on the resulting structure, and exposing an active region of the first collector film and a collector sinker region of the buried collector; forming a second collector film and a collector sinker film on the active region of the first collector film and the collector sinker region of the buried collector, respectively; forming a second ion-implantation mask on the resulting structure and exposing the collector sinker film; and implanting ions into the collector sinker film.

In accordance with a further aspect of the present invention, there is provided a method for forming collector device in a bipolar device, the method comprising the steps of: providing a silicon substrate; forming a first insulating film on the silicon substrate; patterning the first insulating film, exposing two region of the silicon substrate; forming a semiconductor film on the exposed two region of the silicon substrate, and forming a first thermal oxide film on the semiconductor film; forming, in order, a second insulating film and a silicon film on the resulting structure; etching the silicon film using a mask to define an active region and exposing the second insulating film; forming a field oxide film, by oxidizing the silicon film; exposing the semiconductor films by removing the second insulating film and the first thermal oxide film; selectively growing a first collector film using the semiconductor film as a seed layer in such a manner that the first collector film fully covers the first insulating film; planarizing the first collector film using a chemical-mechanical polishing; forming a first ion-implantation mask on the first collector film, exposing both sides of the first collector film; forming a buried collector, by applying an ion implantation process to the exposed both sides of the first collector film; removing the first ion-implantation mask; forming a third insulating film on the resulting structure and exposing the active region of the first collector film; and selectively forming a second collector film on the active region of the first collector film.

In accordance with a still further aspect of the present invention, there is provided a method for forming collector device in a bipolar device, the method comprising the steps of: providing a silicon substrate; forming a first insulating film on the silicon substrate; patterning the first insulating film, exposing two region of the silicon substrate; forming a semiconductor film on the exposed two regions of the silicon substrate, and forming a first thermal oxide film on the semiconductor films; forming, in order, a second insulating film and a silicon film on the resulting structure; etching the silicon film using a mask to define an active region and exposing the second insulating film; forming a field oxide film, by oxidizing the silicon film; exposing the semiconductor films by removing the first thermal oxide films and the second insulating film; selectively growing a first collector film using the semiconductor films as a seed layer in such a manner that the first collector film fully covers the first insulating film; planarizing the first collector film using a chemical-mechanical polishing; forming a first ion-implantation mask on the first collector film, exposing both sides of the first collector film; forming a buried collector, by applying an ion implantation process to the exposed both sides of the first collector film; removing the first ion-implantation mask; forming a third insulating film on the resulting structure and exposing a portion of the first collector film and a portion of the buried collector film; selectively forming a second collector film and a collector sinker film on the first collector film and the buried collector film, respectively; forming a second ion-implantation mask on the resulting structure and exposing the collector sinker film; and implanting ions into the collector sinker film.

BRIEF DESCRIPTION OF THE DRAWING

The above and other objects, advantages and features of the present invention will be more apparent from the following detailed description taken with the attached drawings in which.

DETAILED DESCRIPTION OF THE PREFERRED EMBODIMENTS

Hereinafter, the present invention will be described below in detail referring to the accompanying drawings.

<The first embodiment>

Figure 3A:
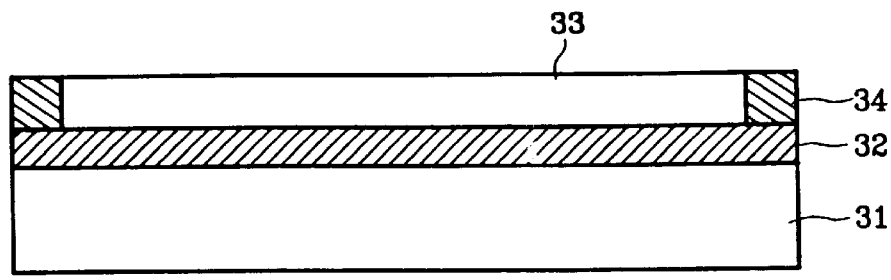
FIGS. 3A through 3C are cross-sectional views illustrating a collector of the bipolar device in accordance with the first embodiment of the present invention.
Figure 3B:
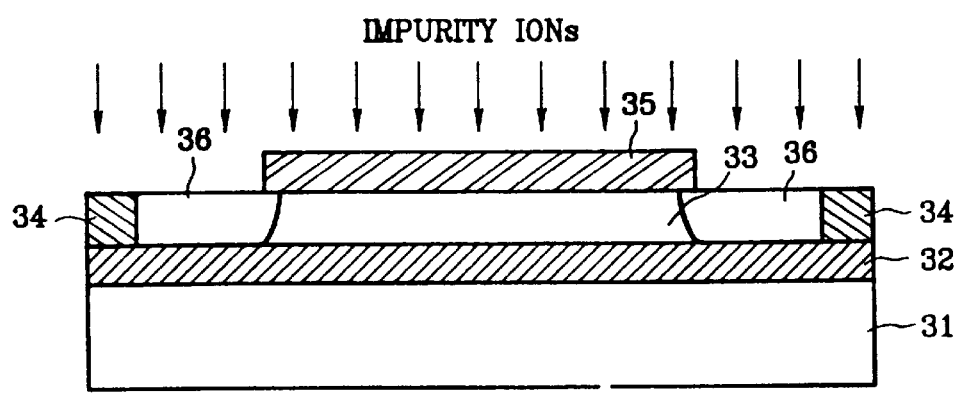
Figure 3C:
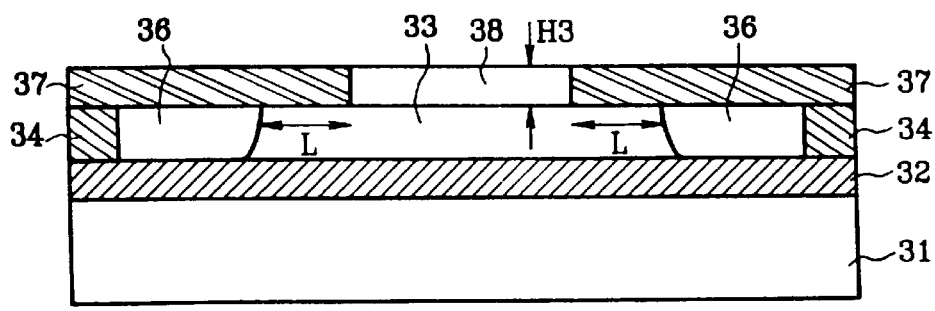

FIGS. 3A through 3C are cross-sectional views illustrating a collector of the bipolar device in accordance with the first embodiment of the present invention. Referring to FIG. 3A, a field silicon oxide film 34 is formed on an SOI (silicon on insulator) substrate using a mask to define a device region. The SOI (silicon on insulator) substrate is provided by forming, in order, a buried silicon oxide film 32 and a conductive silicon film for a first collector film 33 on a silicon substrate.

Referring to FIG. 3B, an ion-implantation mask 35 is formed on the conductive silicon film 33 and patterned to define a buried collector region. Also, a buried collector 36 is formed in the first collector film 33 to be exposed, by implanting impurity ions into the exposed portion of the first collector film 33. At this time, the buried collector 36 has the same impurity type as the first collector film 33.

Referring to FIG. 3C, after removing the ion-implantation mask 35, a first silicon oxide film 37 is deposited on the resulting structure, and a portion of the first silicon oxide film 37 is removed, using a mask to define an active region, thereby exposing the active region of the first collector film 33. A second collector film 38 selectively grows on the active region of the first collector film 33 so that a horizontal collector is formed by the ion implanting process and the selective growing method.

<The second embodiment>

Figure 4A:
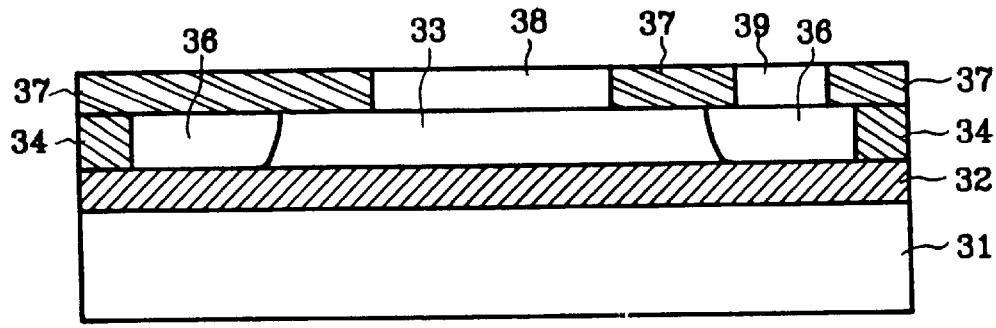
FIGS. 4A through 4C are cross-sectional views illustrating a collector of the bipolar device in accordance with the second embodiment of the present invention.
Figure 4B:
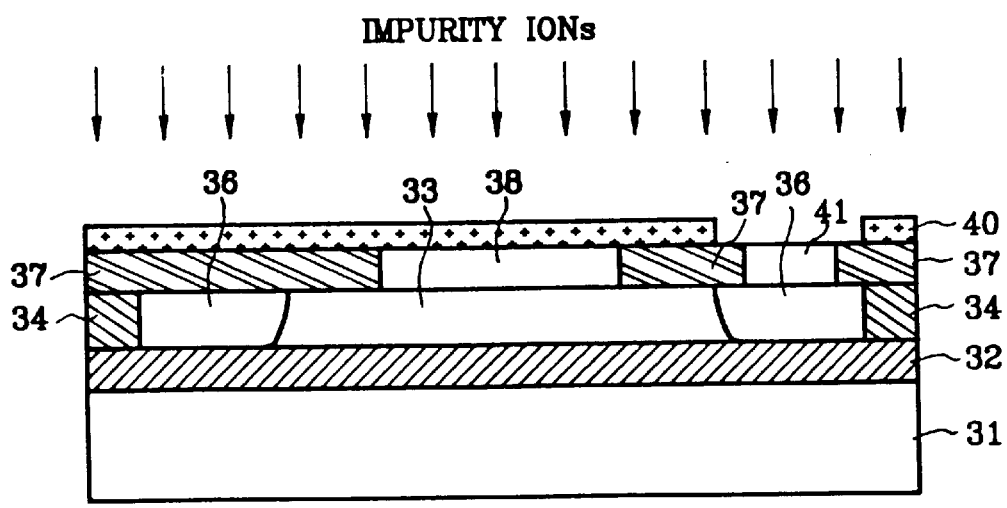
Figure 4C:
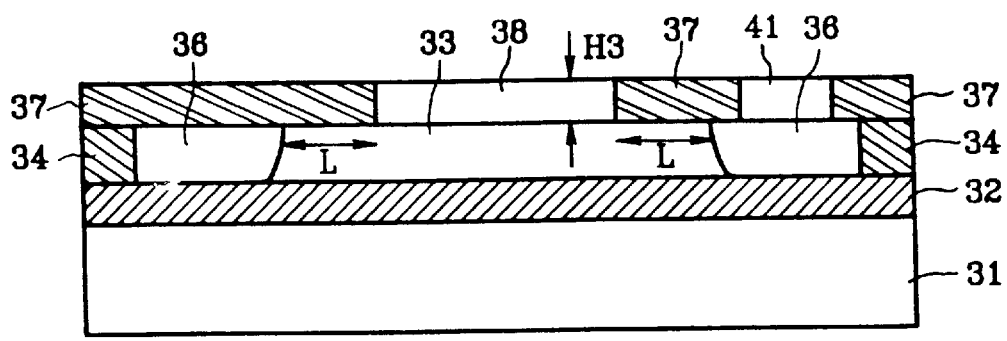

FIGS. 4A through 4C are cross-sectional views illustrating a collector of the bipolar device in accordance with the second embodiment of the present invention.

Referring to FIG. 4A, after performing the steps shown in FIGS. 3A and 3B, the ion-implantation mask 35 is removed from the structure. The first silicon oxide film 37 is formed thereon and patterned using a mask to define an active region of the first collector film and a collector sinker region of the buried collector, thereby exposing portions of the first collector film 33 and the buried collector 36. A second collector film 38 and a third collector film 39 grow on the active region of the first collector film 33 and the buried collector 36, respectively.

Referring to FIG. 4B, a photoresist film 40 is formed thereon and patterned to expose a portion of the third collector film 39 and then a collector sinker 41 is formed by implanting impurity ions into the third collector film 39. Similarly, the ions implanted into the third collector film 39 have the same impurity type as those to have been implanted into it.

Finally, referring to FIG. 4C, the photoresist film 40 is removed. Accordingly, the collector according to the second embodiment further includes the collector sinker 41 in the horizontal collector of the first embodiment.

<The third embodiment>

FIGS. 5A through 5H are cross-sectional views illustrating a collector of a bipolar device in accordance with the third embodiment of the present invention.

Figure 5A:
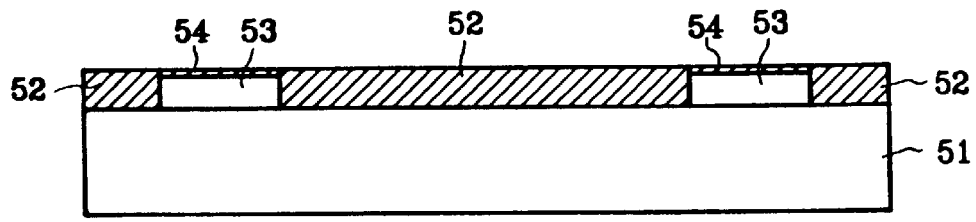
FIGS. 5A through 5H are cross-sectional views illustrating a collector of the bipolar device in accordance with the third embodiment of the present invention.

First, referring to FIG. 5A, a first silicon oxide film 52 is deposited on a silicon substrate 51, and the first silicon oxide film 52 is patterned using a mask to define two seed regions, thereby exposing two regions of the silicon substrate 51.

A semiconductor film 53 to be used as a seed layer is selectively formed on the two exposed silicon substrates 51 and the surface of the semiconductor film 53 is oxidized by the thermal treatment process, thereby forming a thermal oxide film 54 thereon.

Figure 5B:
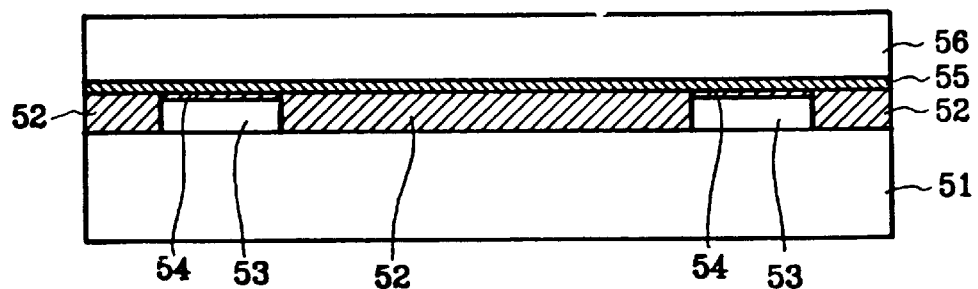

Next, referring to FIG. 5B, a first silicon nitride film 55 and a polycrystalline silicon film 56 are, in order, formed on the resulting structure.

Figure 5C:
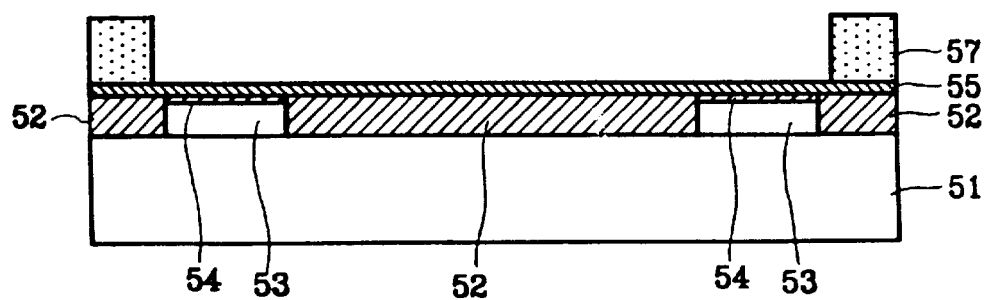

Referring to FIG. 5C, the polycrystalline silicon film 56 is patterned using a mask to define a device region and removed. The thermal oxidation process is applied to the remaining polycrystalline silicon film 56 so that a second thermal oxide film 57 is formed. On the other hand, in forming the second thermal oxide film 57, there are two methods, the one of which is to oxidize the patterned polycrystalline silicon film 56 as stated above, and the other of which is to deposit a silicon oxide film and to pattern it. In the case of the first method illustrated in FIG. 5C, since the etching ratio of the first silicon nitride film 55 to the polycrystalline silicon film 56 is very high such that the loss of the first silicon nitride film 55 may not be large. Accordingly, the etching point may be exactly controlled on the surface of the first silicon oxide film 55.

However, the first method has a drawback in that the thermal oxidation process might be required. In the case of the second method to use the silicon oxide film, since the etching ratio of the first silicon nitride film 55 to the silicon oxide film is very low, it is very difficult to control the etching point without the loss of the silicon nitride film 55. However, this second method has an advantage of the simplification in the processing steps. For this reason, as an alternative, a polysilicon may replace the first nitride layer in the second method. In the following description only the first nitride layer will be cited to avoid confusion.

Figure 5D:
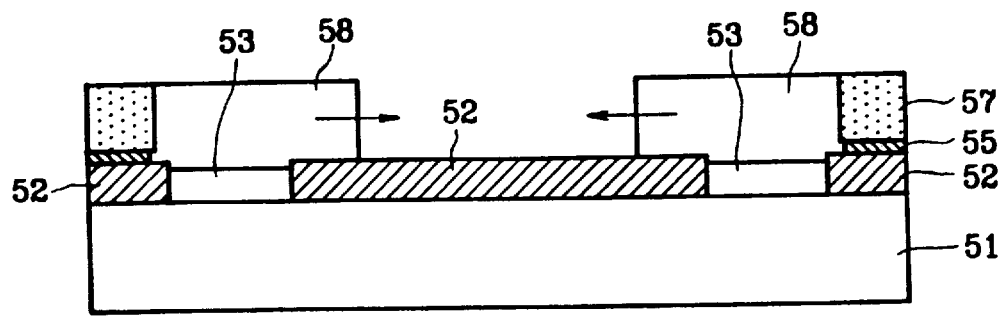

Referring to FIG. 5D, the first silicon nitride film 55 is pattern using the second thermal oxide film 57 as an etching mask. By doing so, a field insulation film, which is composed of the first silicon nitride film 55 and the second thermal oxide film 57, is formed.

Figure 5E:
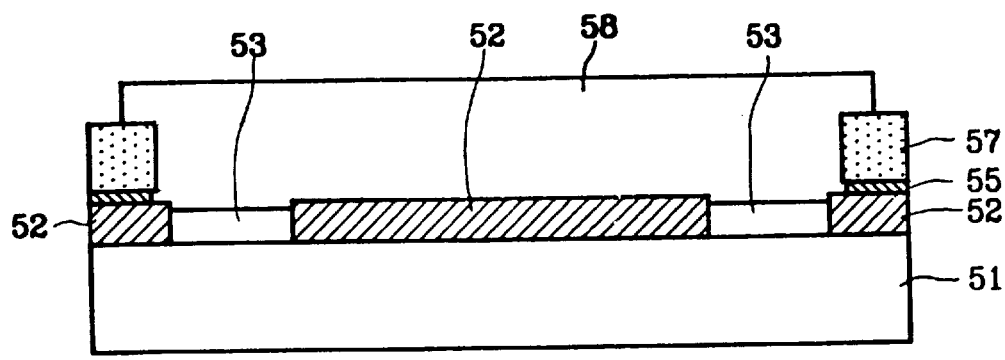
Figure 5F:
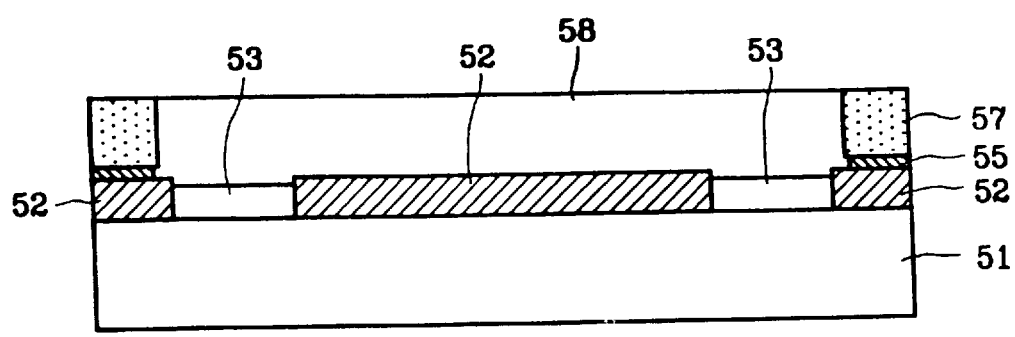

Also, after removing the first thermal oxide film 54 which is exposed by patterning the first silicon nitride film 55, a first collector film 58 is selectively formed using the semiconductor film 53 as a seed layer. At this time, the growth of the first collector film 58 is carried out with the in-situ doping process. The first collector film 58 may grow over the first silicon oxide film 52. Since this overgrowth of the first collector film 58 is performed upwardly and laterally, as shown in FIG. 5E, it can grow over the second thermal oxide film 57 and then the thickness thereof can be thicker than that of the first silicon nitride film 55 and the second thermal oxide film 57. In this case, as shown in FIG. 5F, the planarization should be carried out by chemically and mechanically polishing the first collector film 58.

Figure 5G:
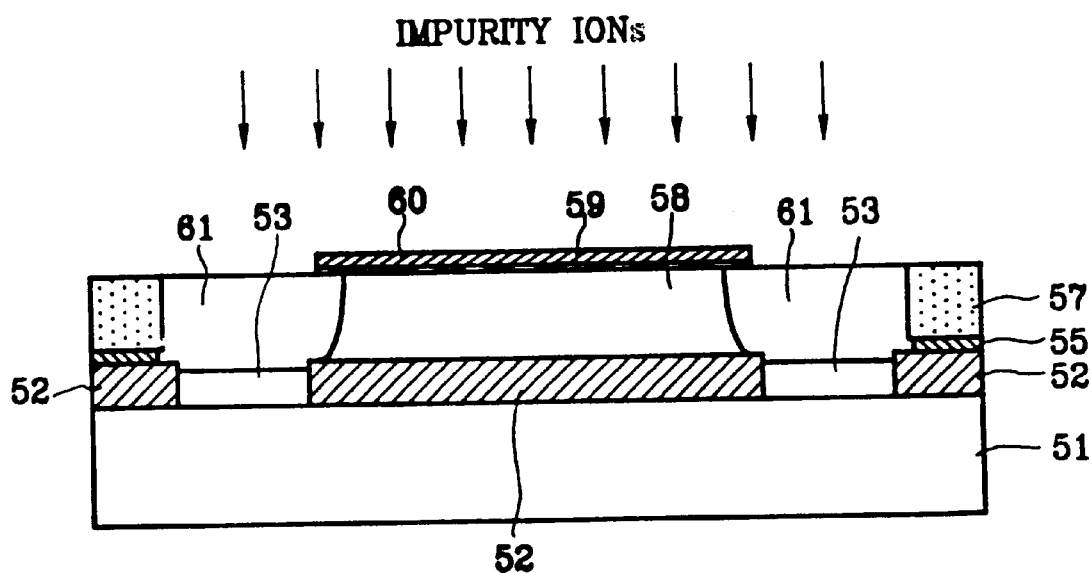

Referring now to FIG. 5G, after forming, in order, a second silicon oxide film 59 and a second silicon nitride film 60 on the first collector film 58, the second silicon oxide film 59 and the second silicon nitride film 60 are patterned using a mask to define a buried collector region.

To form a buried collector film 61, impurity ions are implanted into the first collector film 58, and the ions have the same impurity type as those to have been implanted into it.

Figure 5H:
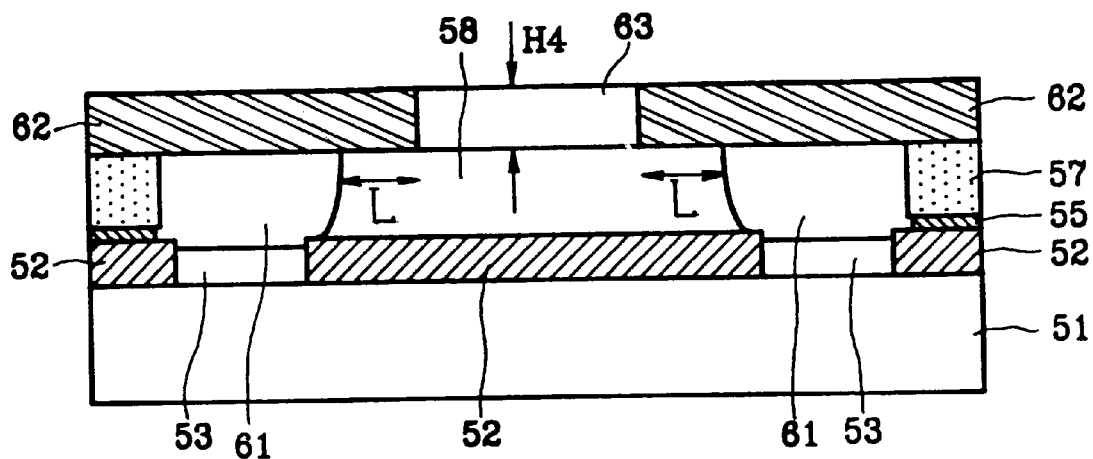

Finally, referring to FIG. 5H, after removing the second silicon nitride film 60 and the second silicon oxide film 59 used as an implanting mask, a third silicon oxide film 62 is formed on the resulting structure. The third silicon oxide film 62 is patterned using a mask to define an active region, exposing a portion of the first collector film 58. A second collector film 63 is selectively formed on the first thin collector film 58 so that a horizontal collector, which is isolated from the silicon substrate 51 by the buried oxide film, is formed by the ion implantation and the selective growing methods.

<The fourth embodiment>

Figure 6A:
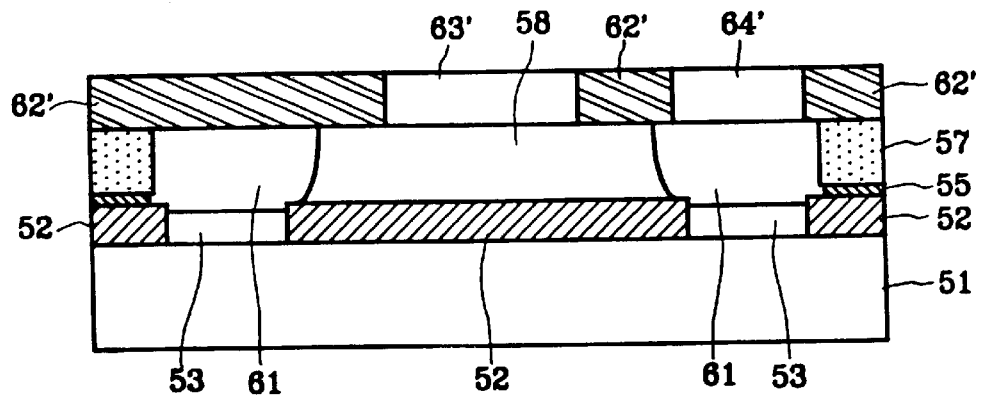
FIGS. 6A through 6C are cross-sectional views illustrating a collector of the bipolar device in accordance with the fourth embodiment of the present invention.
Figure 6B:
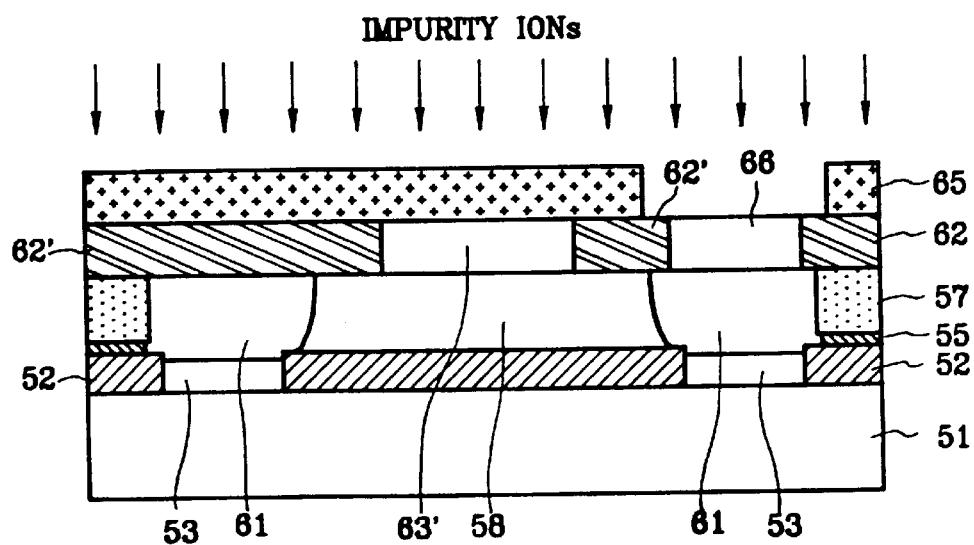
Figure 6C:
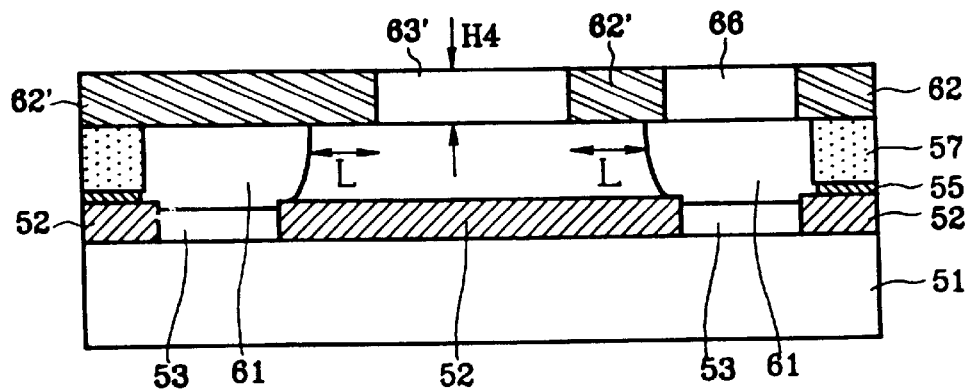

FIGS. 6A through 6C are cross-sectional views illustrating a collector of a bipolar device in accordance with the fourth embodiment of the present invention.

Referring to FIG. 6A, after forming the steps shown in FIGS. 5A though 5G of the third embodiment, the second silicon nitride film 60 and the second silicon oxide film 59 are removed and a third silicon oxide film 62' is formed on the resulting structure. The third silicon oxide film 62' is patterned using a mask to define an active region together with a collector sinker region, exposing a portion of the first collector film 58 and a portion of the buried collector film 61. A second collector film 63' and a third thin collector film 64' are respectively formed on the first thin collector film 58 and the buried collector film 61.

Next, referring now to FIG. 6B, a photoresist film 65 is formed on the resulting structure and patterned to expose the third collector film 64' in the collector sinker region. To form a collector sinker 66, impurity ions are implanted into the third collector film 64', and the ions have the same impurity type as those to have been implanted into the first collector film 58.

Finally, referring to FIG. 6C, the photoresist film 65 is removed. As a result, the fourth embodiment further includes a collector sinker 66 which is formed on the horizontal collector.

Figure 1:
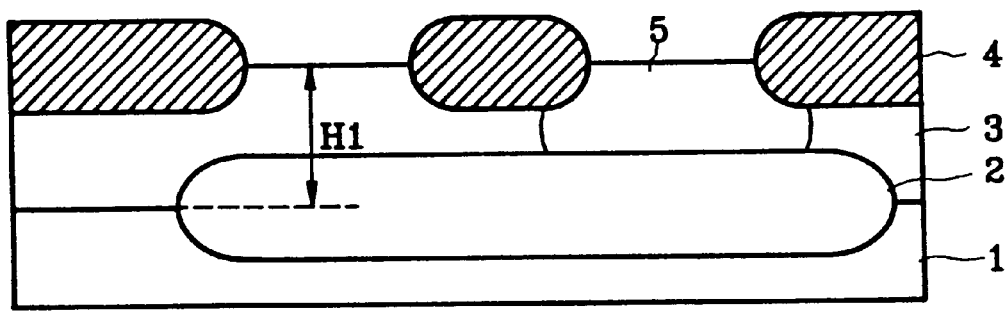
FIG. 1 is a cross-sectional view illustrating a collector in a conventional bipolar device, which is formed by a nonselective ion-implanting process.
Figure 2:
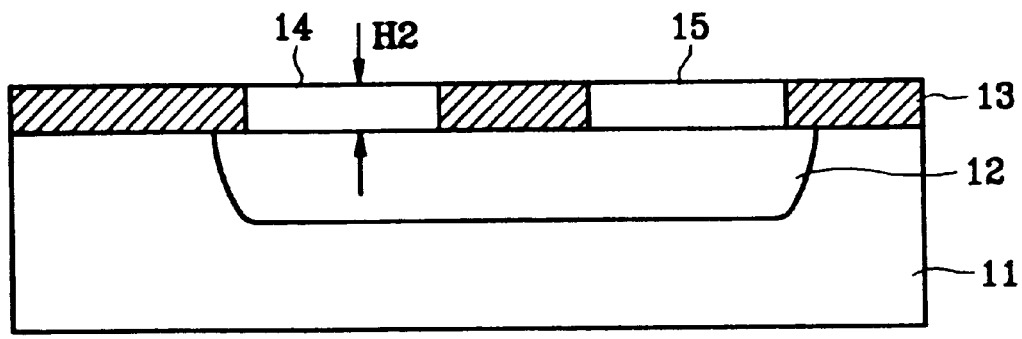
FIG. 2 is a cross-sectional view illustrating a collector in a conventional bipolar device, which is formed by a selective epitaxial growing process.

Referring again to FIG. 3C, the horizontal collector according to the first embodiment is formed by selectively forming the second collector film 38 on the buried collector 36. Because the thickness of the second collector film 38, H3, and the length of the first collector film 33 of the horizontal structure, L, may determine the thickness of the collector, the breakdown voltage of the collector increases. On the other hand, in the conventional collector film shown in FIGS. 1 and 2, the thickness of the collector film 3 or 14 must be increased vertically to increase the thickness of the collector H1 or H2, and the acceleration energy for implanting ions become higher when the collector sinker 5 is formed in FIG. 1.

However, the collector sinker 5 can not be electrically connected to the buried collector film 2 due to an insufficient acceleration energy so that the collector resistance may considerably increase. In particular, in the case of the collector illustrated in FIG. 2, the selective growing methods are carried out separately. That is, since the thin collector film 14 of a lightly doped region and the collector sinker 15 of a heavily doped region must be formed with the same thickness, the selective growing method is carried out twice. Further, because the selective growing method has a low rate in growth as compared with the nonselective growing method, it takes a lot of time to fabricate the collector and the resistance of the collector may increase in proportion to the increment of the thickness of H1 or H2.

However, the thickness of the collector film 33 is not increased vertically but is increased horizontally by "L" and the buried collector 36 is easily fabricated by the ion implantation process, and also the first collector film 33 is surrounded by the buried collector 36. Accordingly, the collector of the first embodiment has an effect on the increase of the area of the cross section of the collector. As a result, although the collector increases in thickness by "L", the increase of the resistance of the collector in the first embodiment is lower than that in the prior art such that the reduction of the operating speed in the first embodiment is lower than that in the prior art. Further, the interrelation between the high breakdown voltage and the low resistance of the collector is adjusted to the most favorable condition, by controlling the concentration of the impurity such that the high power and fast operating speed may be simultaneously obtained. Since the first collector film 33 and the buried collector 36 are isolated from the semiconductor substrate 31 by the silicon oxide film 32, there is no parasite capacitance between the collector and the substrate so that the operating speed may not be decreased by the parasite capacitance stated above.

Referring again to FIG. 4C, the collector according to the second embodiment of the present invention further includes the collector sinker 41 which extends the buried collector up to the surface of the second silicon oxide film 37, having the same effects as was stated in the first embodiment.

Referring again to FIG. 5H, the collector according the third embodiment of the present invention has an advantage in that the silicon substrate is used instead of the expensive SOI substrate which is used in the first and second embodiment. The three film growing methods are carried out to form the selective silicon film. That is, after forming the first silicon oxide film 52, the semiconductor film 53 as a seed layer is formed on the silicon substrate 51, and the silicon nitride film 55 and the polycrystalline silicon film 56 are, in order, deposited on the resulting structure. These films 55 and 56 are patterned using the mask to define the device region (the polycrystalline silicon film to be patterned is oxidized by the oxidation process), and the first collector film 58 grows after exposing the semiconductor film 53. Next, the buried collector film is formed by the ion implantation and the second collector film 63 is selectively formed after defining the active region. As a result, the first collector film 58 is vertically formed on the first silicon oxide film 52 and, in the case of the overgrowth of the first collector film 58, its thickness is controlled by the chemical and/or mechanical polishing processes. In the conventional collector, since the collector and the buried collector film are vertically connected to the collector sinker formed by the ion implantation, the collector sinker cannot be connected to the buried collector film when the thickness of the collector is thick. However, in the present invention, even if the thickness of the first thin collector film 58 is very thick, there is no problem in this connection because the buried collector film 61 is horizontally connected to the first thin collector film 58. Further, because the semiconductor film 53 to be used as a seed layer remains undoped, the parasitic junction capacitance between the semiconductor film 53 and the silicon substrate 51 is decreased so that the operating speed may not be decreased.

Also, since the first thin collector film 58 is isolated from the silicon substrate 51 by the first silicon oxide film 52, parasite junction capacitance is not created as illustrated in the first embodiment. The third embodiment has a drawback in the complexity of the processing steps, however, it is not necessary to form the SOI substrate by the oxygen ion introducing process or the substrate junction process. Accordingly, it may lower costs due to unuse of the SOI substrate.

Referring again to FIG. 6C, the collector according to the fourth embodiment of the present invention further includes the collector sinker 66 which extends the buried collector 61 up to the surface of the third silicon oxide film 62, having the same effects as was stated in the third embodiment.

As apparent from the above, by increasing the length of the thin collector film without an increase of the thickness thereof and by surrounding the collector with the buried collector film, the area of the cross section, through which the current flows, is increased such that resistance may be considerably decreased. Also, because it is possible to decrease the thickness of the horizontal collector due to the decrease of the resistance, it will not take a lot of time to fabricate the collector according to the present invention. In other words, comparing the time required to obtain an arbitrary breakdown voltage in the vertical collector with that in the horizontal collector, with respect to the same breakdown voltage, the present invention may require a short processing time. As a result, the present invention provides improved electrical characteristics in a high power and fast operating speed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming collector device in a bipolar device, the method comprising the steps of:

providing a silicon substrate;

forming a first insulating film on the silicon substrate;

patterning the first insulating film, exposing two region of the silicon substrate;

forming a semiconductor film on the exposed two region of the silicon substrate, and forming a first thermal oxide film on the semiconductor film;

forming, in order, a second insulating film and a silicon film on the resulting structure;

etching the silicon film using a mask to define an active region and exposing the second insulating film;

forming a field oxide film, by oxidizing the silicon film;

exposing the semiconductor films by removing the second insulating film and the first thermal oxide film;

selectively growing a first collector film using the semiconductor film as a seed layer in such a manner that the first collector film fully covers the first insulating film;

planarizing the first collector film using a chemical-mechanical polishing;

forming a first ion-implantation mask on the first collector film, exposing both sides of the first collector film;

forming a buried collector, by applying an ion implantation process to the exposed both sides of the first collector film;

removing the first ion-implantation mask;

forming a third insulating film on the resulting structure and exposing the active region of the first collector film; and selectively forming a second collector film on the active region of the first collector film.

2. The method for forming collector device in accordance with claim 1, wherein the first collector film and the buried collector film have the same impurity type.

3. A method for forming collector device in a bipolar device, the method comprising the steps of:

providing a silicon substrate;

forming a first insulating film on the silicon substrate;

patterning the first insulating film, exposing two region of the silicon substrate;

forming a semiconductor film on the exposed two regions of the silicon substrate, and forming a first thermal oxide film on the semiconductor films;

forming, in order, a second insulating film and a silicon film on the resulting structure;

etching the silicon film using a mask to define an active region and exposing the second insulating film;

forming a field oxide film, by oxidizing the silicon film;

exposing the semiconductor films by removing the first thermal oxide films and the second insulating film;

selectively growing a first collector film using the semiconductor films as a seed layer in such a manner that the first collector film fully covers the first insulating film;

planarizing the first collector film using a chemical-mechanical polishing;

forming a first ion-implantation mask on the first collector film, exposing both sides of the first collector film;

forming a buried collector, by applying an ion implantation process to the exposed both sides of the first collector film;

removing the first ion-implantation mask;

forming a third insulating film on the resulting structure and exposing a portion of the first collector film and a portion of the buried collector film;

selectively forming a second collector film and a collector sinker film on the first collector film and the buried collector film, respectively;

forming a second ion-implantation mask on the resulting structure and exposing the collector sinker film; and implanting ions into the collector sinker film.

4. The method for forming collector device in accordance with claim 3, wherein the first collector film and the buried collector film have the same impurity type.

* * * * *